United States Patent
Shalvi et al.

(10) Patent No.: US 8,437,185 B2
(45) Date of Patent: May 7, 2013

(54) PROGRAMMING ORDERS FOR REDUCING DISTORTION BASED ON NEIGHBORING ROWS

(75) Inventors: Ofir Shalvi, Ra'anana (IL); Eyal Gurgi, Petach Tikva (IL); Uri Perlmutter, Ra'anana (IL); Oren Golov, Hod-Hasharon (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/412,731

(22) Filed: Mar. 6, 2012

(65) Prior Publication Data

US 2012/0163079 A1    Jun. 28, 2012

Related U.S. Application Data (60) Division of application No. 12/721,585, filed on Mar. 11, 2010, now Pat. No. 8,174,905, which is a continuation-in-part of application No. PCT/IL2008/001188, filed on Sep. 3, 2008.

(60) Provisional application No. 60/973,453, filed on Sep. 19, 2007, provisional application No. 61/012,424, filed on Dec. 8, 2007, provisional application No. 61/012,933, filed on Dec. 12, 2007, provisional application No. 61/054,493, filed on May 20, 2008, provisional application No. 61/244,506, filed on Sep. 22, 2009.

(51) Int. Cl.
    *G11C 11/34* (2006.01)
(52) U.S. Cl.
    USPC ............... 365/185.03; 365/185.29; 365/218

(58) Field of Classification Search ............. 365/185.03, 365/185.29, 218
See application file for complete search history.

(56) References Cited

U.S. PATENT DOCUMENTS

| | | | |
|---|---|---|---|
| 5,533,190 | A | 7/1996 | Binford et al. |
| 6,314,043 | B1 * | 11/2001 | Pasotti et al. ............ 365/230.03 |
| 6,314,044 | B1 | 11/2001 | Sasaki et al. |
| 6,480,948 | B1 | 11/2002 | Virajpet et al. |
| 6,732,250 | B2 | 5/2004 | Durrant |
| 7,158,058 | B1 | 1/2007 | Yu |
| 7,312,727 | B1 | 12/2007 | Feng et al. |
| 7,469,049 | B1 | 12/2008 | Feng |

(Continued)

OTHER PUBLICATIONS

U.S. Appl. No. 12/323,544 Official Action dated Mar. 9, 2012.

(Continued)

*Primary Examiner* — Son Dinh
*Assistant Examiner* — Nam Nguyen
(74) *Attorney, Agent, or Firm* — Meyertons, Hood, Kivlin, Kowert & Goetzel, P.C.

(57) ABSTRACT

A method for data storage includes predefining an order of programming a plurality of analog memory cells that are arranged in rows. The order specifies that for a given row having neighboring rows on first and second sides, the memory cells in the given row are programmed only while the memory cells in the neighboring rows on at least one of the sides are in an erased state, and that the memory cells in the given row are programmed to assume a highest programming level, which corresponds to a largest analog value among the programming levels of the cells, only after programming all the memory cells in the given row to assume the programming levels other than the highest level. Data is stored in the memory cells by programming the memory cells in accordance with the predefined order.

14 Claims, 6 Drawing Sheets

U.S. PATENT DOCUMENTS

| | | | |
|---|---|---|---|
| 7,487,394 | B2 | 2/2009 | Forhan et al. |
| 7,574,555 | B2 | 8/2009 | Porat et al. |
| 7,661,000 | B2 | 2/2010 | Ueda et al. |
| 7,797,609 | B2 | 9/2010 | Neuman |
| 7,904,783 | B2 | 3/2011 | Brandman et al. |
| 7,929,549 | B1 | 4/2011 | Talbot |
| 8,065,583 | B2 | 11/2011 | Radke |
| 2005/0144361 | A1 | 6/2005 | Gonzalez et al. |
| 2007/0104211 | A1 | 5/2007 | Opsasnick |
| 2008/0123426 | A1 | 5/2008 | Lutze et al. |
| 2010/0211803 | A1 | 8/2010 | Lablans |
| 2010/0287217 | A1 | 11/2010 | Borchers et al. |
| 2011/0010489 | A1 | 1/2011 | Yeh |
| 2011/0060969 | A1 | 3/2011 | Ramamoorthy et al. |
| 2011/0149657 | A1 | 6/2011 | Haratsch et al. |

OTHER PUBLICATIONS

Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI—2 (SAS-2)", INCITS document T10/1760-D, revision 15a, Feb. 22, 2009.

* cited by examiner

PROGRAMMING ORDERS FOR REDUCING DISTORTION BASED ON NEIGHBORING ROWS

CROSS-REFERENCE TO RELATED APPLICATIONS

This application is a divisional of U.S. patent application Ser. No. 12/721,585, filed Mar. 11, 2010, which is a continuation-in-part of PCT Patent Application PCT/IL2008/001188, filed Sep. 3, 2008, which claims the benefit of U.S. Provisional Patent Application 60/973,453, filed Sep. 19, 2007, U.S. Provisional Patent Application 61/012,424, filed Dec. 8, 2007, U.S. Provisional Patent Application 61/012,933, filed Dec. 12, 2007, and U.S. Provisional Patent Application 61/054,493, filed May 20, 2008. This application claims the benefit of U.S. Provisional Patent Application 61/244,506, filed Sep. 22, 2009. The disclosures of all these related patent applications are incorporated herein by reference.

FIELD OF THE INVENTION

The present invention relates generally to memory devices, and particularly to methods and systems for programming arrays of multi-level analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

Some known methods and systems define specific orders or sequences of programming arrays of analog memory cells, in order to reduce the level of interference in the cells. For example, PCT International Publication WO 2007/146010, whose disclosure is incorporated herein by reference, describes a method for programming a non-volatile memory array comprising a plurality of memory cells. Each cell is adapted to store a lower and an upper page of data. The lower page of predetermined memory cells is programmed with first predetermined data, and the upper page is programmed with second predetermined data. The upper page of the predetermined memory cells is re-programmed with the second predetermined data.

U.S. Patent Application Publication 2003/0002348, whose disclosure is incorporated herein by reference, describes a non-volatile memory system having an array of memory cells with at least one storage element each is operated with a plurality of storage level ranges per storage element. A flash electrically erasable and programmable read only memory (EEPROM) is an example, wherein the storage elements are electrically floating gates. The memory is operated to minimize the effect of charge coupled between adjacent floating gates by programming some cells a second time after adjacent cells have been programmed. The second programming step also compacts a distribution of charge levels within at least some of the programming states.

U.S. Pat. No. 6,781,877, whose disclosure is incorporated herein by reference, describes techniques of reducing erroneous readings of the apparent charge levels stored in a number of rows of memory cells on account of capacitive coupling between the cells. All pages of a first row are programmed with a first pass, followed by programming all pages of a second adjacent row with a first pass, after which the first row is programmed with a second pass, and then all pages of a third row are programmed with a first pass, followed by returning to program the second row with a second pass, and so on, in a back-and-forth manner across the rows of an array. This technique is said to minimize the effect on the apparent charge stored on rows of memory cells that can occur by later writing data into adjacent rows of memory cells.

U.S. Patent Application Publication 2008/0049506, whose disclosure is incorporated herein by reference, describes a method for programming a set of storage elements. The set is programmed beginning with a word line WLn adjacent to a select gate line for the set. After programming the first word line, the next word line WLn+1 adjacent to the first word line is skipped and the next word line WLn+2 adjacent to WLn+1 is programmed. WLn+1 is then programmed. Programming continues according to the sequence {WLn+4, WLn+3, WLn+6, WLn+5, . . . } until all but the last word line for the set have been programmed. The last word line is then programmed.

U.S. Patent Application Publication 2007/0253249, whose disclosure is incorporated herein by reference, describes a method of programming a nonvolatile memory device comprising a plurality of n-valued nonvolatile memory cells arranged in a matrix, wherein n is a natural number greater than or equal to two. The method includes programming i-valued data to three or more memory cells contiguously arranged along a first direction of the matrix before programming (i+1)-valued data to any of the three or more memory cells, wherein i is less than n, and wherein the three or more memory cells are programmed during three or more respectively distinct program periods, and after programming the i-valued data to the three or more memory cells, programming (i+1)-valued data to a particular memory cell among the three or more memory cells.

Other programming orders for multilevel Flash devices are proposed by Takeuchi et al., in "A Multipage Cell Architecture for High-Speed Programming Multilevel NAND Flash Memories," IEEE Journal of Solid-State Circuits, volume 33, issue 8, August, 1998, pages 1228-1238, which is incorporated herein by reference.

SUMMARY OF THE INVENTION

Embodiments of the present invention provide a method for data storage, including:

predefining an order of programming a plurality of analog memory cells that are arranged in rows, wherein the memory cells in each row are associated with a respective word line, and wherein each memory cell is programmable to assume programming levels corresponding to respective analog values written to the memory cell, wherein the order specifies that for a given row having neighboring rows on first and second sides, the memory cells in the given row are programmed only while the memory cells in the neighboring rows on at least one of the sides are in an erased state, and that the memory cells in the given row are programmed to assume one or more highest programming level, which correspond to respective largest analog values among the analog values, only after programming all the memory cells in the given row to assume the programming levels other than the highest levels; and storing data in the memory cells by programming the memory cells in accordance with the predefined order.

In some embodiments, the given row is divided into at least first and second subsets of the memory cells for storing at least first and second memory pages. In one embodiment, the first subset includes odd-order memory cells of the row and the second subset includes even-order memory cells of the row. Additionally or alternatively, the order alternates among the subsets when programming the memory cells in the given row. Further alternatively or additionally, the order specifies that the memory cells in the first subset are programmed to assume the programming levels other than the highest levels only after all the memory cells in the second subset are programmed to assume the programming levels other than the highest levels.

In a disclosed embodiment, when the memory cells in the given rows are subject to cross-coupling interference from the memory cells in the neighboring rows, the method includes reading the data stored in the neighboring rows and processing the read data so as to cancel the cross-coupling interference.

There is also provided, in accordance with an embodiment of the present invention, a method for data storage, including:

defining different first and second orders of programming of a plurality of analog memory cells;

storing first data by programming the analog memory cells in accordance with the first order;

evaluating a predefined switching condition with respect to the memory cells; and responsively to meeting the switching condition, switching from the first order to the second order, and storing second data by programming the analog memory cells in accordance with the second order.

The switching condition may depend on a number of programming and erasure cycles that were applied to the memory cells, on a time that elapsed since a last erasure operation that was applied to the memory cells, on a time that elapsed since a last programming operation that was applied to the memory cells, on an expected time discontinuity in programming the memory cells, on a level of distortion in the memory cells, or on an operating condition of the memory cells.

In one embodiment, the memory cells are arranged in rows, wherein the memory cells in each row are associated with a respective word line, wherein each memory cell is programmable to assume programming levels corresponding to respective analog values written to the memory cell, and one of the first and second orders specifies that for a given row having neighboring rows on first and second sides, the memory cells in the given row are programmed only while the memory cells in the neighboring rows on at least one of the sides are in an erased state, and that the memory cells in the given row are programmed to assume a highest programming level, which corresponds to a largest analog value among the analog values, only after programming all the memory cells in the given row to assume the programming levels other than the highest level.

In another embodiment, each memory cell is programmable to assume programming levels corresponding to respective analog values written to the memory cell, and the second order specifies that all the memory cells in a given row are programmed to contain at least a certain number of the programming levels before any of the memory cells in the given row are programmed to contain a full number of the programming levels.

There is additionally provided, in accordance with an embodiment of the present invention, apparatus for data storage, including:

a memory, which includes a plurality of analog memory cells that are arranged in rows, wherein the memory cells in each row are associated with a respective word line, and wherein each memory cell is programmable to assume programming levels corresponding to respective analog values written to the memory cell; and a control module, which is coupled to predefine a programming order specifying that, for a given row having neighboring rows on first and second sides, the memory cells in the given row are programmed only while the memory cells in the neighboring rows on at least one of the sides are in an erased state, and that the memory cells in the given row are programmed to assume one or more highest programming level, which correspond to respective largest analog values among the analog values, only after programming all the memory cells in the given row to assume the programming levels other than the highest levels, and to store data in the memory cells by programming the memory cells in accordance with the predefined programming order.

There is further provided, in accordance with an embodiment of the present invention, apparatus for data storage, including:

a memory, which includes a plurality of analog memory cells; and a control module, which is coupled to define different first and second orders of programming the analog memory cells, to store first data by programming the analog memory cells in accordance with the first order, to evaluate a predefined switching condition with respect to the memory cells and, responsively to meeting the switching condition, to switch from the first order to the second order and to store second data by programming the analog memory cells in accordance with the second order.

There is additionally provided, in accordance with an embodiment of the present invention, a method for data storage, including:

storing respective first bits in a group of analog memory cells by writing respective first storage values to the memory cells in the group;

after storing the first bits, computing respective second storage values, each second storage value jointly storing a respective second bit and a respective third bit in a respective memory cell; and writing the second storage values into the respective memory cells in the group.

In some embodiments, writing the second storage values includes dividing the second storage values into at least first and second subsets, and writing all the second storage values in the second subset only after writing all the second storage values in the first subset. In an embodiment, the second storage values in the first subset are greater than the second storage values in the second subset. In a disclosed embodiment, the group of the analog memory cells is one of multiple groups of the memory cells that are arranged in respective rows, and the method includes storing the first, second and third bits in each of the groups according to a predefined order.

In another embodiment, the memory cells in each group are divided into at least first and second subsets, and the order defines storage in a monotonic order of the groups, and, within each group, storage of the first bits in the first subset, followed by storage of the first bits in the second subset, followed by storage of the second and third bits in the first subset, followed by storage of the second and third bits in the second subset. In yet another embodiment, the memory cells in each group are divided into at least first and second subsets, and the order defines storage of the first bits in the first subset of a given group, followed by storage of the first bits in the second subset of a given group, followed by storage of the second and third bits in the first subset of another group, followed by storage of the second and third bits in the second subset of the other group.

There is also provided, in accordance with an embodiment of the present invention, apparatus for data storage, including:

a memory, which includes a plurality of analog memory cells; and a control module, which is configured to store respective first bits in a group of the memory cells by writing respective first storage values to the memory cells in the group, to compute, after storing the first bits, respective second storage values, each second storage value jointly storing a respective second bit and a respective third bit in a respective memory cell, and to write the second storage values into the respective memory cells in the group.

The present invention will be more fully understood from the following detailed description of the embodiments thereof, taken together with the drawings in which:

DETAILED DESCRIPTION OF EMBODIMENTS

Overview

Arrays of analog memory cells often suffer from distortion effects, such as cross-coupling interference and programming disturb. In many cases, the order in which the cells are programmed affects the level of distortion in the cells. For example, when the cells are programmed using a closed-loop Program and Verify (P&V) process, distortion that is already present when the cells are programmed is inherently compensated for. Thus, if cells that potentially cause distortion to a certain target cell are programmed before the target cell, the distortion in the target cell will be compensated for by the P&V process.

As another example, the level of program disturb in a given row of cells may depend on the order in which the rows are programmed in the array. Typically, the level of program disturb in the $N^{th}$ row may be higher if the $N^{th}$ row is programmed later than both the $(N+1)^{th}$ row and the $(N-1)^{th}$ row, in comparison to programming the $N^{th}$ row when either the $(N+1)^{th}$ row or the $(N-1)^{th}$ row is still erased. Specifically, the program disturb in a given cell depends on its bit line voltage.

Embodiments of the present invention that are described hereinbelow provide improved methods and systems for programming arrays of multi-level analog memory cells. In some embodiments, a control module accepts data for storage and stores the data in an array of multi-level analog memory cells, in accordance with a predefined programming order. The array comprises multiple memory cells that are arranged in rows and columns. The cells along each row are connected to a common word line and the cells along each column are connected to a common bit line.

The programming orders used by the control module provide an improved trade-off of cross-coupling interference and program disturb. These programming orders are based on two principles:

1. The array is programmed in a monotonic (increasing or decreasing) order of word lines, so that all bits in a given word line are programmed before continuing to the next (higher or lower) word line.
2. Within a given word line, all bits other than the bits mapped to the programming level having the highest storage values (usually threshold voltages) are programmed first, in all the cells in the word line. The bits associated with the highest storage values are programmed only after programming of the other bits is completed for all cells in the word line.

Principle (1) ensures that when a given word line is programmed, the cells in neighboring word lines on at least one side of this word line will be in an erased state. As a result, program disturb effects are reduced. Principle (2) reduces the cross-coupling interference among memory cells within a given word line. Since the bits associated with the highest analog values are programmed last, potentially-interfering cells in the word line are already partially-programmed when the potentially-interfered cells are programmed to their final values. As a result, the P&V process compensates for the majority of the cross-coupling interference within the word line.

In some memory device configurations, a given word line stores multiple memory pages. For example, the memory device may store one page in the odd-order cells of the word line, and another page in the even-order cells. In such configurations, programming typically alternates between the odd and even pages in the word line, until all but the pages associated with the highest analog values are programmed. Several examples of programming orders for four-level, eight-level and sixteen-level cells are described below.

In some embodiments, the control module changes the programming order during the life cycle of the memory array, in order to adapt to different conditions and circumstances. The control module initially stores data in the array using a certain initial programming order. At some point in time, the control module evaluates a predefined switching condition. If the condition is met, the control module switches to a different programming order. Different criteria and switching conditions are described further below.

In some embodiments, the control module programs multiple memory pages jointly in a given group of memory cells. Several examples of joint programming schemes are described herein. The joint programming schemes can be combined with various word line programming orders, to provide a flexible trade-off between cross-coupling interference, program disturb and programming speed.

System Description

Figure 1:
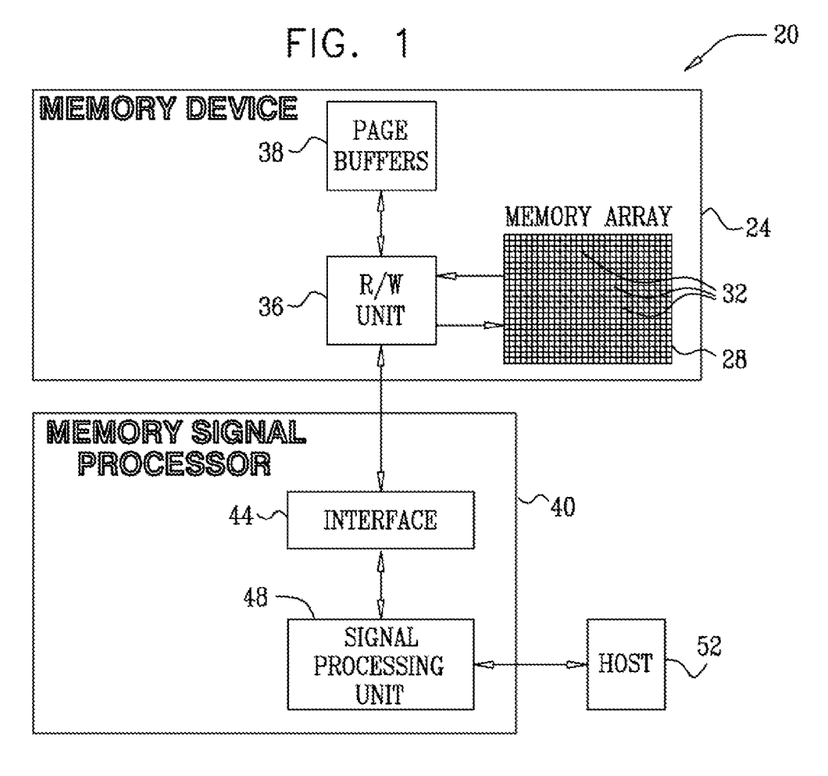
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. Memory cells 32 comprise Multi-Level Cells (MLC, also referred to as multi-bit cells), each storing multiple data bits.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values to the cell.

Memory device 24 comprises a reading/writing (R/W) unit 36, which converts data for storage in the memory device to storage values and writes them into memory cells 32. In alternative embodiments, the R/W unit does not perform the conversion, but is provided with voltage samples, i.e., with the storage values for storage in the cells. The R/W unit typically (although not necessarily) programs the cells using an iterative Program and Verify (P&V) process, as is known in the art. When reading data out of array 28, R/W unit 36 converts the storage values of memory cells 32 into digital samples having a resolution of one or more bits. Data is typically written to and read from the memory cells in groups that are referred to as pages. Memory device 24 comprises one or more page buffers 38, which are used for caching data pages during data storage and retrieval.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 produces the storage values for storing in the memory cells and provides these values to R/W unit 36. Alternatively, unit 48 provides the data for storage, and the conversion to storage values is carried out by the R/W unit internally to the memory device.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which the memory array is disposed. Further alternatively, some or all of the functionality of MSP 40 can be implemented in software and carried out by a processor or other element of the host system, or by a suitable memory controller. In some implementations, a single MSP 40 may be connected to multiple memory devices 24. In yet another embodiment, some or all of the MSP functionality may be carried out by a separate unit, referred to as a memory extension, which acts as a slave of memory device 24.

Typically, the MSP (or any other controller or processor that carries out some or all of the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Memory cells 32 of array 28 are typically arranged in a grid having multiple rows and columns, commonly referred to as word lines and bit lines, respectively. The array is typically divided into multiple pages, i.e., groups of memory cells that are programmed and read simultaneously. Cells are typically erased in groups of word lines that are referred to as erasure blocks.

In some embodiments, R/W unit 36 programs memory cells 32 using an iterative Program and Verify (P&V) process. In a typical P&V process, an entire memory page is written by applying a sequence of programming pulses to a group of memory cells that are mapped to this page. The level of the programming pulses increases incrementally from pulse to pulse. The storage values programmed in the cells are read ("verified") after each pulse, and the iterations continue until the desired levels are reached.

Interference and Programming Order in Multi-Level Memory Cells

Arrays of analog memory cells, and in particular Multi-Level Cell (MLC) arrays, suffer from various types of distortion of interference. For example, floating-gate memory cells often suffer from cross-coupling interference from neighboring cells. Cross-coupling interference causes a change in the storage value read from an interfered cell due to changes in the charge levels of one or more interfering cells. Another distortion mechanism, commonly referred to as program disturb or disturb noise, causes a change in the charge of a cell due to voltages applied to the cell when programming other cells in the array.

In many cases, the level of distortion in an array of memory cells depends on the relative order in which the cells are programmed. For example, P&V processes are closed-loop processes, which inherently compensate for distortion that is present at the time the cells are being programmed. Therefore, if a potentially-interfered cell is programmed using a P&V process after a potentially-interfering cell has already been programmed, the P&V process will inherently compensate for at least some of the distortion caused by the potentially-interfering cell. On the other hand, if the potentially-interfering cell is programmed later than the potentially-interfered cell (i.e., if the potentially-interfering cell is not programmed at the time the potentially-interfered cell is programmed), then the P&V process will not compensate for the distortion. In intermediate cases, e.g., when the potentially-interfering cell is partially-programmed at the time the potentially-interfered cell is programmed, the P&V process applied to the potentially-interfered cell will compensate for only part of the distortion.

As another example, the level of program disturb in a given row of cells may depend on the order in which the rows are programmed in the array. Typically, the level of program disturb in the $N^{th}$ row may be higher if the $N^{th}$ row is programmed later than both the $(N+1)^{th}$ row and the $(N-1)^{th}$ row, in comparison to programming the $N^{th}$ row when either the $(N+1)^{th}$ row or the $(N-1)^{th}$ row are still erased. Specifically, the level of program disturb in a given cell depends on the cell's bit line voltage.

Embodiments of the present invention provide improved methods and systems for programming arrays of multi-level analog memory cells. The methods and systems described herein program the cells in orders that reduce both cross-coupling interference and program disturb.

The methods and systems described herein use the fact that programming only a subset of the bits of a multi-level cell means programming the cell to a lower storage value. In other words, each additional bit programmed to a multi-level cell increases its storage value. This property is demonstrated in FIG. 2.

Figure 2:
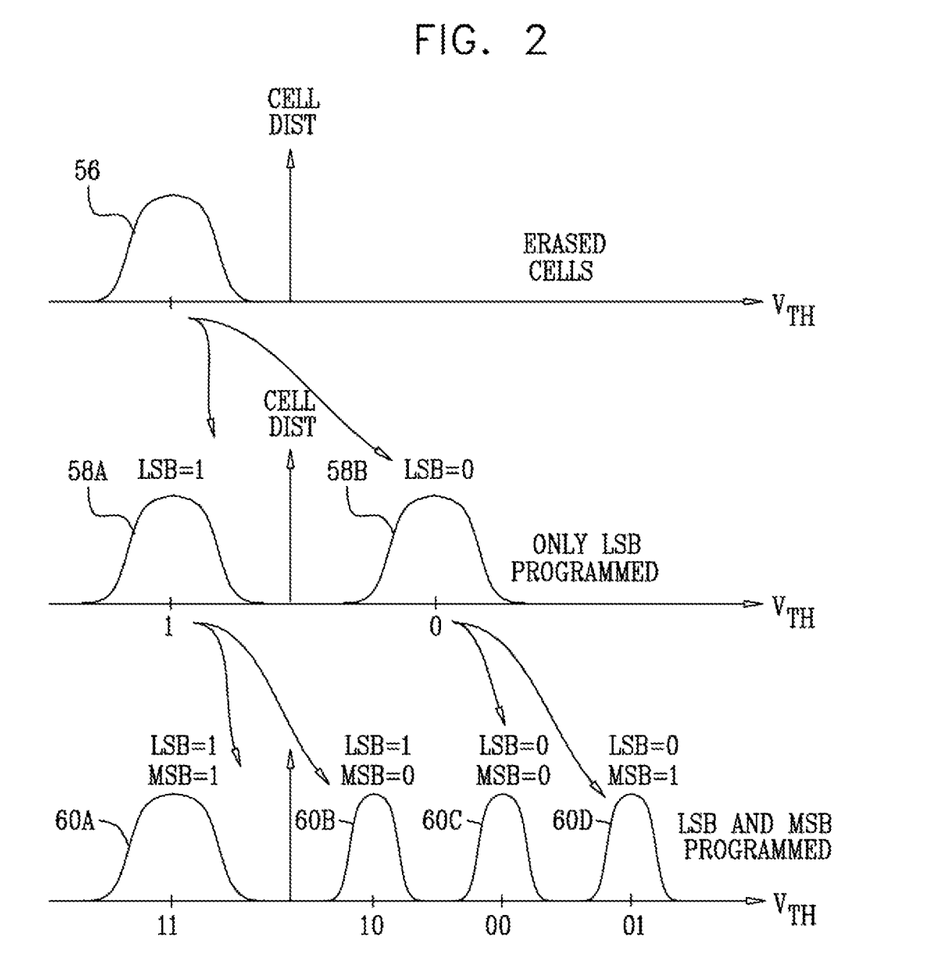
FIG. 2 is a graph showing threshold voltage distributions in multi-level analog memory cells, in accordance with an embodiment of the present invention.

FIG. 2 is a graph showing threshold voltage distributions in a group of multi-level analog memory cells, in accordance with an embodiment of the present invention. In the present example, the cells comprise four-level cells, with each cell capable of storing two bits. The first bit written to the cell is referred to as a Least Significant Bit (LSB) and the second bit written to the cell is referred to as a Most Significant Bit (MSB). The terms LSB and MSB are used, however, purely for the sake of clarity, and do not imply that some bits are more important than others. Any other convenient terminology for referring to individual bits in the cell can also be used.

The top graph in FIG. 2 shows the threshold voltage distribution of the cells when all the cells are erased, i.e., before any programming is performed. At this stage, all the cells assume a single erased level 56, in which the threshold voltages are statistically distributed around a certain nominal erased level.

The middle graph in FIG. 2 shows the threshold voltage distribution of the cells when only the LSBs are programmed. In accordance with the programming scheme of FIG. 2, cells that are to store an LSB value of "1" are not subjected to any programming, and remain at a level 58A similar to the erased level. Cells that are to store an LSB value of "0" are programmed to assume a level 58B.

The bottom graph in FIG. 2 shows the threshold voltage distribution of the cells after both the LSBs and MSBs are programmed. For cells that store an LSB="1" value (cells in level 58A), an MSB="1" value is stored by refraining from adding charge to the cells, thus retaining the cells at a level 60A. In order to program an MSB="0" value to a cell that stores an LSB="1" value, charge is added to the cell, causing the cell to assume a level 60B. In order to program MSB="0" to a cell that stores an LSB="0" value, charge is added to the cell, causing the cell to transition from level 58B to a level 60C. Programming MSB="1" to a cell that stores an LSB="0" value is accomplished by adding charge to the cell, so as to cause the cell to transition from level 58B to a level 60D.

As can be appreciated from this example, the threshold voltage of a cell that was programmed with only the first bit is lower than the threshold voltage of the cell after programming both bits. A group of cells in which only the first bits are programmed has, on average, lower storage values that a group of cells that is fully-programmed. In other words, cells that are partially-programmed have lower analog storage values than cells that are fully-programmed.

The example of FIG. 2 refers to a particular programming scheme of a 2 bits/cell array. However, the property according to which cells that are programmed with only a subset of the bits have lower storage values than cells that are fully-programmed is equally applicable to various other programming schemes and to memory cells storing higher numbers of bit. For example, embodiments that use 3 bits/cell memory cells storing an LSB, Central Significance Bit (CSB) and MSB are described further below.

As noted above, a memory array typically comprises a large number of memory cells that are arranged in rows and columns. The cells along each row are connected to a word line, and the cells along each column are connected to a bit line. A page of data is typically written simultaneously to a group of cells along a word line.

In some memory configurations, each word line (row) stores a single page. In other configurations, different bits of a multi-level cell are mapped to different pages. For example, in a group of 2 bits/cell memory cells, one page can be stored in the LSBs of the cells and another page can be stored in the MSBs. In the description that follows, a page stored in the LSBs of the cells is referred to as an LSB page, and a page stored in the MSBs is referred to as an MSB page for brevity.

Additionally or alternatively, some memory device configurations partition the cells along each word line into two or more groups, e.g., into odd-order and even-order cells, and store different pages in the different groups. Thus, a row of 2 bits/cell memory cells may store four memory pages—one page in the LSBs of the odd-order cells, a second page in the MSBs of the odd-order cell, a third page in the LSBs of the even-order cells and a fourth page in the MSBs of the even-order cells. Configurations that divide each word line into four groups or into any other number of groups, are also feasible. Typically although not necessarily, the cells along each word line is partitioned into groups in an interleaved manner.

Figure 3:
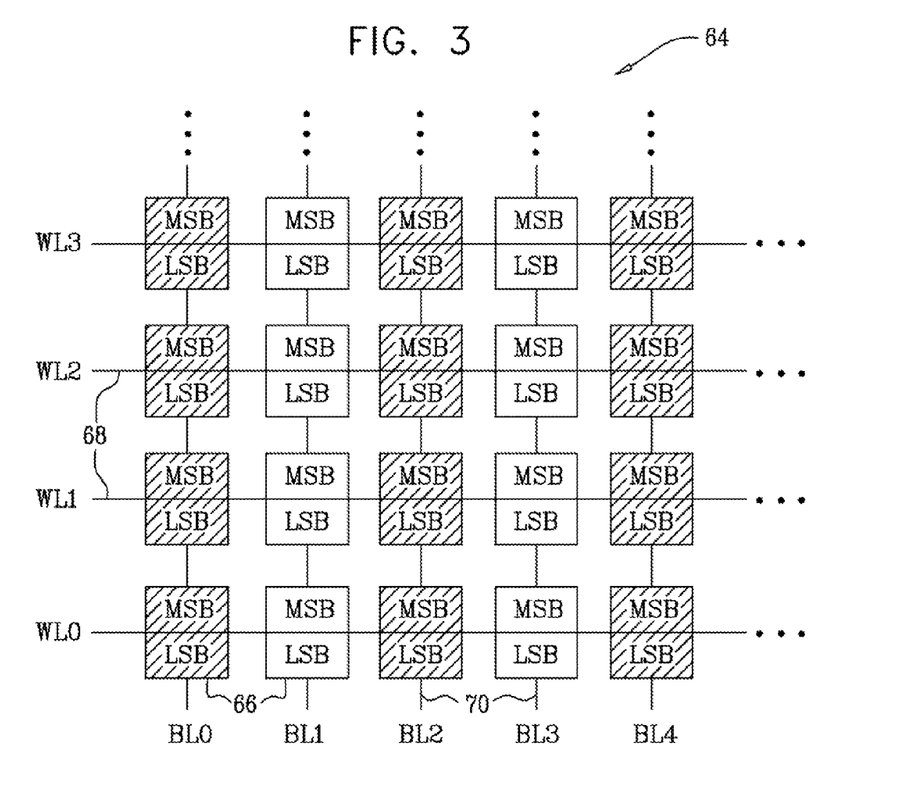
FIG. 3 is a diagram that schematically illustrates an array of multi-level analog memory cells, in accordance with an embodiment of the present invention.

FIG. 3 is a diagram that schematically illustrates an array 64 of multi-level analog memory cells 66, in accordance with an exemplary embodiment of the present invention. Cells 66 are connected by word lines 68 and bit lines 70. In the present example, cells 66 comprise 2 bits/cell memory cells, and each word line is divided into odd- and even-order cells. The odd-order cells are shaded in the figure. Thus, each word line 68 stores four memory pages, referred to as LSB/ODD, LSB/EVEN, MSB/ODD and MSB/EVEN.

Page Programming Orders for Reduced Interference

The programming orders defined herein provide an improved trade-off of cross-coupling interference and program disturb. These programming orders are based on two principles:
1. The array is programmed in a monotonic (increasing or decreasing) order of word lines, so that all pages (bits) in a given word line are programmed before continuing to the next (higher or lower) word line.
2. Within a given word line, the lower-order pages (bits) are programmed first for all the cells in the word line. The highest-significance bits (MSB page or pages) are programmed only after programming of lower-significance bits is completed for all cells in the word line.

Principle (1) above ensures that when a given word line is programmed, the cells in neighboring word lines on at least one side of this word line will be in an erased state. As a result, program disturb effects are reduced.

Principle (2) above reduces the cross-coupling interference among memory cells within a given word line (also referred to as horizontal cross-coupling, because the interfering cells belong to the same word line as the interfered cell). Since the MSB pages are programmed last, potentially-interfering cells in the word line are already partially-programmed when the potentially-interfered cells are programmed to their final values. As a result, the P&V process compensates for the majority of the cross-coupling interference within the word line.

In some embodiments, principle (2) above is extended, so as to ensure that the one or more highest programming levels are programmed only after the programming levels other than the highest levels are programmed, for all the cells in the given word line.

Note that a given word line may store multiple pages, such as in odd-order and even-order cells. In such configurations, programming typically alternates between the odd and even pages in the word line, until all but the highest programming levels (MSB pages) are programmed.

In bit programming terminology, principle (2) above means that, within a given word line of an M-bit MLC device, the first M−1 bits of all cells are programmed first. The $M^{th}$ bits of the cells in the word line are programmed only after programming of the first M−1 bits is completed.

The following table demonstrates a possible programming order that follows principles (1) and (2) above:

| Word line | Bit | EVEN | ODD |
|---|---|---|---|
| N | MSB | 6N + 4 | 6N + 5 |
| N | CSB | 6N + 2 | 6N + 3 |
| N | LSB | 6N | 6N + 1 |
| ... | ... | ... | ... |
| 3 | MSB | 22 | 23 |
| 3 | CSB | 20 | 21 |
| 3 | LSB | 18 | 19 |
| 2 | MSB | 16 | 17 |
| 2 | CSB | 14 | 15 |
| 2 | LSB | 12 | 13 |
| 1 | MSB | 10 | 11 |
| 1 | CSB | 8 | 9 |
| 1 | LSB | 6 | 7 |
| 0 | MSB | 4 | 5 |
| 0 | CSB | 2 | 3 |
| 0 | LSB | 0 | 1 |

The table defines an order for programming an array of 3 bits/cell memory cells. The array has N word lines. The cells in each word lines are partitioned into odd- and even-order cells, so that each word line stored six pages. In accordance with the table, the word lines are programmed in a monotonically-increasing order starting from word line 0. Within each word line, the order of programming is EVEN/LSB, ODD/LSB, EVEN/CSB, ODD/CSB, EVEN/MSB and finally ODD/MSB.

In alternative embodiments, the word lines can be programmed in a monotonically-decreasing order. Further alternatively, the odd-order page in a given bit can be programmed before the corresponding even-order bit. Any other suitable variation to this order may be applied, while meeting principles (1) and (2) above.

Another possible programming order is described in the following table:

| Word line | Bit | EVEN | ODD |
|---|---|---|---|
| N | MSB | 6N + 4 | 6N + 5 |
| N | CSB | 6N + 1 | 6N + 3 |
| N | LSB | 6N | 6N + 2 |
| ... | ... | ... | ... |
| 3 | MSB | 22 | 23 |
| 3 | CSB | 19 | 21 |
| 3 | LSB | 18 | 20 |
| 2 | MSB | 16 | 17 |
| 2 | CSB | 13 | 15 |
| 2 | LSB | 12 | 14 |
| 1 | MSB | 10 | 11 |
| 1 | CSB | 7 | 9 |
| 1 | LSB | 6 | 8 |

-continued

| Word line | Bit | EVEN | ODD |
|---|---|---|---|
| 0 | MSB | 4 | 5 |
| 0 | CSB | 1 | 3 |
| 0 | LSB | 0 | 2 |

In this programming order, there is no alternation between odd and even pages when programming the LSB and CSB. This order is sometimes preferable, because the CSB page in a given word line is programmed immediately following the LSB page. This proximity may simplify page buffering operations carried out when programming the cells. On the other hand, this advantage may come at the expense of increased cross-coupling when the cells are not fully-programmed, e.g., the cross-coupling when programming the even-order CSB page. As in the previous example, various variations can be applied to the programming order, as long as principles (1) and (2) above are met.

The following three tables show exemplary programming orders for 4 bits/cell memory cells:

| Word line | Bit | EVEN | ODD |
|---|---|---|---|
| N | MSB | 8N + 6 | 8N + 7 |
| N | CSB2 | 8N + 2 | 8N + 5 |
| N | CSB1 | 8N + 1 | 8N + 4 |
| N | LSB | 8N | 8N + 3 |

| Word line | Bit | EVEN | ODD |
|---|---|---|---|
| N | MSB | 8N + 6 | 8N + 7 |
| N | CSB2 | 8N + 4 | 8N + 5 |
| N | CSB1 | 8N + 1 | 8N + 3 |
| N | LSB | 8N | 8N + 2 |

| Word line | Bit | EVEN | ODD |
|---|---|---|---|
| N | MSB | 8N + 6 | 8N + 7 |
| N | CSB2 | 8N + 4 | 8N + 5 |
| N | CSB1 | 8N + 2 | 8N + 3 |
| N | LSB | 8N | 8N + 1 |

In some embodiments, the programming order is set and carried out within memory device 24. In these embodiments, R/W unit 36 comprises a control module that defines the programming order, maps pages to groups of memory cells 32 accordingly, and stores data in the memory cells in accordance with the order. In alternative embodiments, the programming order is set and carried out by the MSP or by another controller that sends data for storage in device 24. In these embodiments, the MSP or controller comprises a control module (which may be implemented in hardware and/or in software) that defines the programming order and controls the memory device to store data in the memory cells in accordance with the appropriate order.

Figure 4:
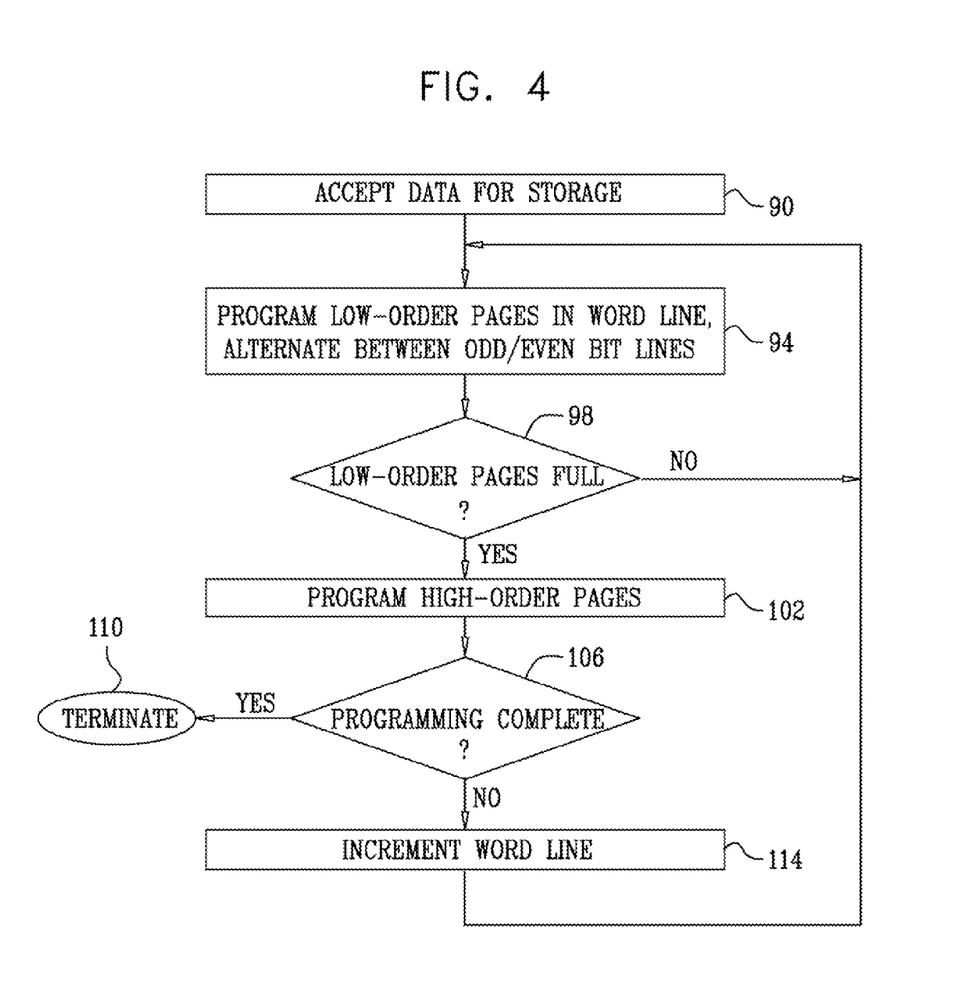
FIGS. 4 and 5 are flow charts that schematically illustrate methods for programming arrays of multi-level analog memory cells, in accordance with embodiments of the present invention.

FIG. 4 is a flow chart that schematically illustrates a method for programming a block of M bits/cell analog memory cells, in accordance with an embodiment of the present invention. The description that follows assumes that the programming order is set and carried out by R/W unit 36. As noted above, however, the method may also be carried out by an MSP or other controller that controls the memory device.

The method of FIG. 4 begins with R/W unit 36 accepting data for storage in array 28, at an input step 90. The R/W unit stores the data starting from a certain initial word line. The R/W unit first stores data in the M−1 lower-significance bits of the cells in the word line, at a first programming step 94. The M−1 lower-significance bits (pages) of the word line can be programmed in any suitable order, such as the exemplary orders described above. In some embodiments, the R/W unit alternates between odd and even cells (bit lines). The R/W unit checks whether all M−1 lower-significance bits of the cells in the word line were programmed, at a low-order checking step 98. If not, the method loops back to step 94 above.

Once all M−1 lower-significance bits of the cells in the word line are programmed, the R/W unit programs the highest-significance bits (the MSB pages), at a second programming step 102. At this stage, the current word line is fully-programmed. The R/W unit checks whether all data has been stored, at a completion checking step 106. If all data has been stored, the method terminates, at a termination step 110.

Otherwise, i.e., when there is data remaining for storage, the R/W unit progresses to the next word line, at an incrementing step 114. The method then loops back to step 94 above, and R/W unit 36 begins to store data in the memory cells of the next word line. In the present example, the programming order defines that data is stored in ascending order of word lines. Alternatively, however, data can be stored in the word lines in descending order.

Some of the programming orders described above are optimal for reducing program disturb and horizontal cross-coupling (cross-coupling from other cells in the same word line), but do not always account for vertical cross-coupling (cross-coupling from cells in neighboring word lines). In order to reduce vertical cross-coupling in the cells in a given word line, system 20 may read the storage values of the cells in one or more neighboring word lines and use these values to compensate for the cross-coupling.

Cross-coupling compensation can be carried out in different ways. For example, the MSP may adjust the read thresholds used for reading the potentially-interfered word line based on the values read from the potentially-interfering word lines, or it may correct the storage values of the cells in the potentially-interfered word line based on the values read from the potentially-interfering word lines. Alternatively, the MSP may compute soft metrics for decoding an Error Correction Code (ECC) that encodes the data in the cells of potentially-interfered word line based on the values read from the potentially-interfering word lines, or carry out any other process that reduces or cancels the vertical cross-coupling using data or storage values read from one or more potentially-interfering word lines.

Cross-coupling cancellation methods that can be used for this purpose are described, for example in PCT International Publication WO 2007/132453, entitled "Distortion Estimation and Cancellation in Memory Devices," filed May 10, 2007, PCT International Publication PCT/IL2007/001059, entitled "Estimation of Non-Linear Distortion in Memory Devices," filed Aug. 27, 2007, PCT International Publication WO 2007/132457, entitled "Combined Distortion Estimation and Error Correction Coding for Memory Devices," filed May 10, 2007, and U.S. patent application Ser. No. 11/995,814, entitled "Reading Memory Cells using Multiple Thresholds," filed Jan. 15, 2008, whose disclosures are incorporated herein by reference.

When performing digital cancellation of vertical cross-coupling interference using the techniques described above, the R/W unit typically reads the pages of one or more potentially-interfering neighboring word lines in addition to reading the potentially-interfered word line. The R/W unit then caches the potentially-interfered pages and the potentially-interfering pages in page buffers 38 in order to apply interference cancellation. Some of the programming orders described herein are particularly suitable for combining with interference cancellation. When pages are read sequentially in accordance with such orders, the potentially-interfering pages are read in close proximity to the potentially-interfered page. As a result, the size of buffers 38 can be reduced.

In some MLC reading schemes, a higher-significance bit of a given cell is decoded based on the read results of a lower-significance bit that was read previously. For example, in some reading schemes the LSB page is read first, and the CSB page is read and decoded based on the read results of the LSB page. Some of the programming orders described herein, in which CSB pages are programmed (and read) in close proximity to the LSB pages of the same cells, are particularly suitable for combining with such reading schemes. When using these orders, the size of page buffers 38 can be reduced. Reducing the size of the page buffers is particularly important in multi-die or multi-plane memory configurations.

Modifying the Programming Order During the Lifecycle of the Memory

An explained and demonstrated above, different programming orders have different advantages and disadvantages. A certain programming order may be optimal for reducing certain types of interference under certain conditions, but may not be optimal under different circumstances. The interference in a memory array may change over time. In such a case, a programming order that is optimal for a newly-deployed array may not be optimal several years later. For example, the level of program disturb typically increases with the number of Programming and Erasure (P/E) cycles that the cells have gone through. Thus, it may be preferable to apply a certain programming order that is best-suited for reducing cross-coupling at the beginning of the memory's life, and switch to another programming order that is better suited for reducing program disturb at a later stage. Other conditions of the array, such as temperature, also have an effect on distortion. A change in these conditions may cause a given programming order to become sub-optimal.

In some embodiments of the present invention, the control unit (in the memory device or in the MSP or controller) modifies the order in which pages are programmed during the lifecycle of the memory, i.e., after the memory has been installed and is operating in a host system. Various triggers and criteria (referred to herein as "switching conditions") can be used for triggering a switch from one programming order to another. For example, the control unit may switch to a different programming order based on the number of P/E cycles the memory cells have gone through (e.g., when the number of P/E cycles exceeds a certain threshold), based on the time that elapsed since the last programming operation or based on the time that elapsed since the last erase operation. As another example, the control unit may measure or estimate the distortion level in the cells (or estimate separate distortion levels attributed to different distortion mechanisms), and switch to a different programming order in response to the measured distortion levels.

In one embodiment, the control unit may switch between the following two programming orders (or programming schemes):

Order 1: First the LSB, CSB and MSB pages of the odd cells of wordline N are programmed, then the LSB, CSB and MSB pages of the even cells of wordline N, then the LSB, CSB and MSB pages of the odd cells of wordline N+1, and so on.

Order 2: A group of cells are programmed to contain at least a certain number of levels before the neighboring cells are programmed to the full number of levels. An example of this type of order is the programming order described above, in which first the LSB page of the odd cells of wordline N is programmed, then the LSB page of the even cells of the line, then the CSB page of the odd cells, CSB page of the even cells, MSB page of the odd cells, MSB page of the even cells, and only then wordline N+1.

While order 2 is more robust than order 1 against floating-gate interference, order 1 may allow faster programming than order 2, since the cells can be programmed at once to eight levels (rather than programmed to two levels, then to four levels and only then to eight levels). Therefore order 1 is chosen when the level of distortions in the cells is small, and the device can tolerate higher floating-gate interference. When the level of distortions grows higher (for example, in cells in which the level of retention errors is high due to a large number of past program and erase operations), the controller chooses order 2.

Further alternatively, the control unit may use one programming order when sequentially programming a large group of pages, and another programming order when programming single pages or small groups of pages in an intermittent manner. In other words, the control unit may choose the programming order depending on the expected time discontinuity when programming the cells.

For example, as explained above, some programming orders provide lower cross-coupling interference between partially-programmed cells at the expense of other performance parameters. These programming orders may be preferable when the cells are programmed to different levels with large time gaps. Therefore, if it is known in advance that the data accepted for storage at a given time will program a group of cells only partially, it may be preferable to use a programming order having lower cross-coupling interference between partially-programmed cells. In other cases, i.e., when the data accepted for storage will fully-program the cells in question, cross-coupling between partially-programmed cells is not a major concern. In such cases, it may be preferable to use a different programming order that improves other performance parameters.

Certain operating conditions of the memory device, such as temperature, can also be used as criteria for changing the programming order. The programming orders may comprise any suitable orders, such as the orders described herein and/or the orders described in the Background section above.

Figure 5:
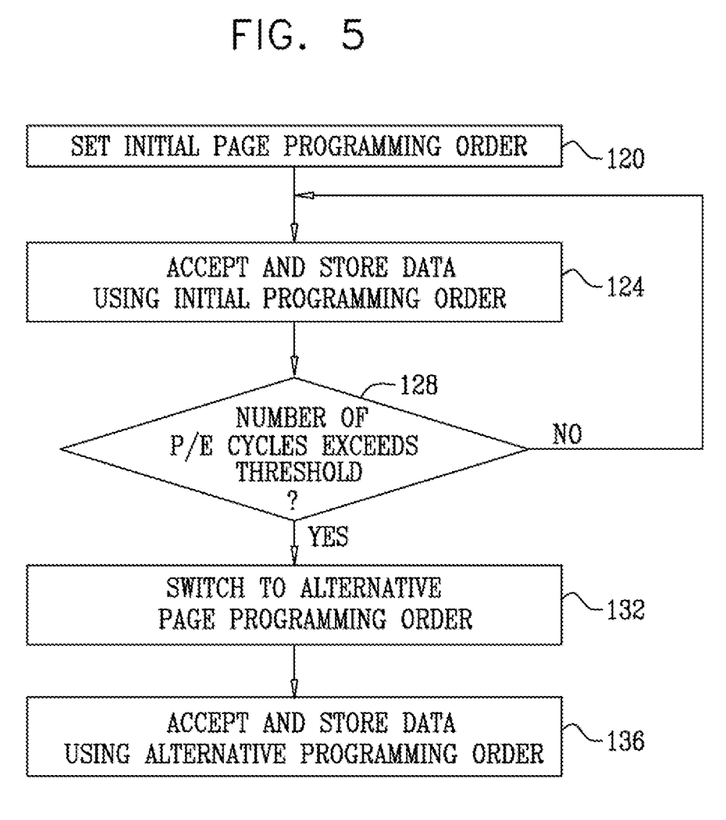

FIG. 5 is a flow chart that schematically illustrates a method for programming array 28 of multi-level analog memory cells 32, in accordance with an embodiment of the present invention. The method begins with the control unit setting an initial page programming order, at an initialization step 120. Initially, system 20 stores data in array 28 in accordance with the initial order, at an initial storage step 124.

The control unit tracks the number of P/E cycles of the cells, and checks whether the number of P/E cycles exceeds a predefined threshold, at a switch checking step 128. If the number of P/E cycles has not yet exceeded the threshold, the method loops back to step 124, and the system continues to store data in accordance with the initial programming order.

If, on the other hand, the number of P/E cycles exceeds the threshold, the control unit switches to an alternative page programming order, at a switching step 132. In the present example, the alternative programming order is better suited for reducing disturb noise, possibly at the expense of some other performance degradation. The system now begins to store data in array 28 in accordance with the alternative programming order, at an alternative storage step 136.

Although FIG. 5 shows a single switching operation during the memory's lifetime, the control unit may switch between programming orders multiple times, as desired. For example, the control unit may continually track the level of distortion in the array and match the page programming order to the current distortion level.

Joint Programming of Multiple Pages

In the embodiments described above, R/W unit 36 programs each page (e.g., LSB, CSB or MSB page) separately. See, for example, FIG. 2 above. In alternative embodiments, R/W 36 may jointly program more than one page into a group of memory cells. For example, the R/W unit may program the LSB page in a given group of memory cells, and then program the CSB and MSB pages jointly. Joint programming is sometimes advantageous since it increases programming speed.

Figure 6:
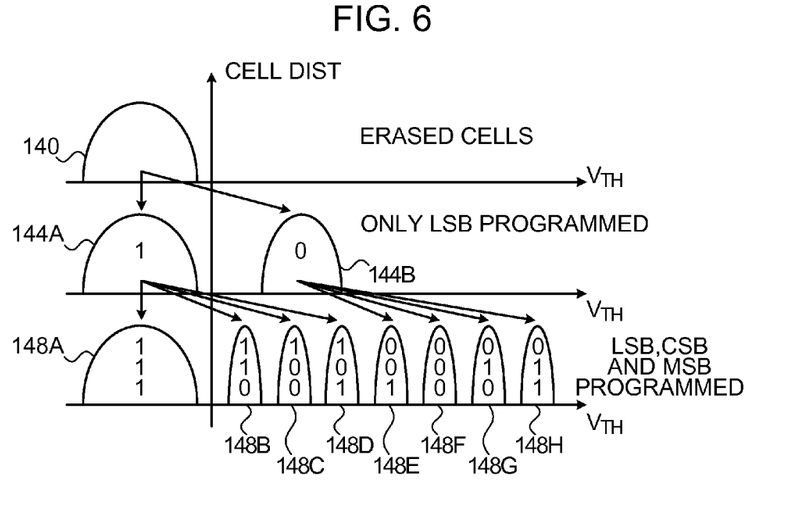
FIGS. 6 and 7 are graphs showing processes of programming arrays of multi-level analog memory cells, in accordance with alternative embodiments of the present invention.

FIG. 6 is a graph showing a process of programming an array of multi-level analog memory cells, in accordance with an embodiment of the present invention. The example of FIG. 6 refers to a group of 3 bits/cell MLC, which stores an LSB page in the LSBs of the cells, a CSB page in the CSBs of the cells, and an MSB page in the MSBs of the cells. Programming of the three pages is performed in two stages. In the first stage, R/W unit 36 programs the LSB page, and in the second stage the R/W unit programs the CSB and MSB pages jointly.

Before programming begins, the memory cells in the group are erased, and their threshold voltages are distributed according to a distribution 140. In the first programming stage, R/W unit 36 programs the LSBs of the cells in the group, i.e., programs the LSB page. After LSB programming, the threshold voltages are distributed in two programming levels 144A and 144B, which represent LSB="1" and LSB="0", respectively.

In the second programming stage, the R/W unit calculates, for each memory cell, the increase in threshold voltage that should be written in the memory cell in order to program it with the respective CSB and MSB. After LSB programming, each memory cell has a threshold voltage that is either in distribution 144A or in distribution 144B, depending on its LSB value. For each memory cell, the R/W unit calculates the additional programming needed for increasing the memory cell's threshold voltage to one of eight distributions 148A . . . 148H. The R/W unit programs each memory cell with the appropriate value, which brings the cell's threshold voltage to the distribution that represents its LSB, CSB and MSB values. Thus, the second programming stage converts two distributions 144A and 144B into eight distributions 148A . . . 148H concurrently. Typically, the entire second stage of programming is performed using a single P&V programming sequence.

Figure 7:
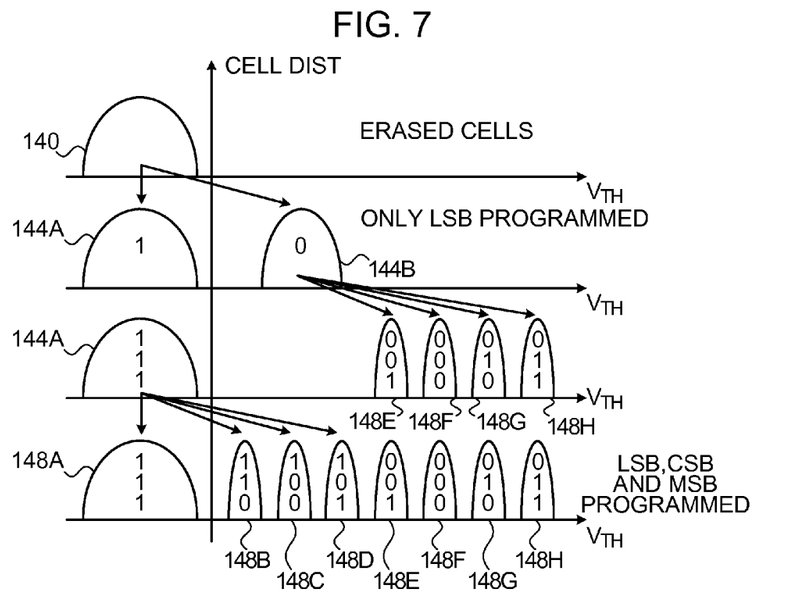

FIG. 7 is a graph showing a process of programming an array of multi-level analog memory cells, in accordance with an alternative embodiment of the present invention. In this embodiment, the second programming stage is split into two sub-stages, each sub-stage programming a subset of the memory cells.

In the first programming stage, R/W unit 36 produces distributions 144A and 144B, similarly to the scheme of FIG. 6 above. Then, the subset of memory cells that belong to distribution 144B are programmed with the CSB and MSB jointly, so as to produce distributions 148E . . . 148H. The R/W unit calculates the additional programming needed for increasing the threshold voltage of each memory cell in distribution 144B to one of distributions 148E . . . 148H, and applies this additional programming to the memory cells. After programming the memory cells from distribution 144B to distributions 148E . . . 148H, the R/W unit programs the memory cells in distribution 144A with the CSB and MSB jointly, so as to produce distributions 148A . . . 148D.

Note that in the scheme of FIG. 7, distributions 148E . . . 148H, which have higher threshold voltages than distributions 148A . . . 148D, are programmed first. This programming order helps to reduce interference.

In some embodiments, the joint programming scheme of FIG. 6 or 7 can be combined with a given word line programming order, to provide various trade-offs between cross-coupling interference, disturb noise and programming speed. Consider, for example, the programming order defined by the following table:

| Word line | Bit | EVEN | ODD |
|---|---|---|---|
| N | MSB | 6N + 3 | 6N + 5 |
| N | CSB | 6N + 2 | 6N + 4 |
| N | LSB | 6N | 6N + 1 |
| . . . | . . . | . . . | . . . |
| 1 | MSB | 9 | 11 |
| 1 | CSB | 8 | 10 |
| 1 | LSB | 6 | 7 |
| 0 | MSB | 3 | 5 |
| 0 | CSB | 2 | 4 |
| 0 | LSB | 0 | 1 |

In this order, the word lines are programmed in a monotonic order. Within each word line, the LSB/EVEN page is programmed first, then the LSB/ODD page, then the CSB/EVEN and MSB/EVEN pages, and finally the CSB/ODD and MSB/ODD pages. In each word line, the programming of the CSB/EVEN and MSB/EVEN pages, and the programming of the CSB/ODD and MSB/ODD, can each be performed using the joint programming scheme of FIG. 6 or 7. For example, programming using the scheme of FIG. 7 can be performed using the following sequence:

Program LSB/EVEN page.
Program LSB/ODD page.
Program the four highest programming levels (148E . . . 148H) of the CSB/EVEN and MSB/EVEN pages jointly.
Program the four lowest programming levels (148A . . . 148D) of the CSB/EVEN and MSB/EVEN pages jointly.
Program the four highest programming levels (148E . . . 148H) of the CSB/ODD and MSB/ODD pages jointly.
Program the four lowest programming levels (148A . . . 148D) of the CSB/ODD and MSB/ODD pages jointly.

In an alternative embodiment, programming using the scheme of FIG. 7 can also be performed using the following sequence:

Program LSB/EVEN page.
Program LSB/ODD page.
Program the four highest programming levels (148E . . . 148H) of the CSB/EVEN and MSB/EVEN pages jointly.

Program the four highest programming levels (148E . . . 148H) of the CSB/ODD and MSB/ODD pages jointly.

Program the four lowest programming levels (148A . . . 148D) of the CSB/EVEN and MSB/EVEN pages jointly.

Program the four lowest programming levels (148A . . . 148D) of the CSB/ODD and MSB/ODD pages jointly.

As yet another example, consider the programming order defined by the following table:

| Word line | Bit | EVEN | ODD |
|---|---|---|---|
| N | MSB | 6N + 5 | 6N + 7 |
| N | CSB | 6N + 4 | 6N + 6 |
| N | LSB | 6N − 4 | 6N − 3 |
| . . . | . . . | . . . | . . . |
| 3 | MSB | 23 | 25 |
| 3 | CSB | 22 | 24 |
| 3 | LSB | 14 | 15 |
| 2 | MSB | 17 | 19 |
| 2 | CSB | 16 | 18 |
| 2 | LSB | 8 | 9 |
| 1 | MSB | 11 | 13 |
| 1 | CSB | 10 | 12 |
| 1 | LSB | 2 | 3 |
| 0 | MSB | 5 | 7 |
| 0 | CSB | 4 | 6 |
| 0 | LSB | 0 | 1 |

In this order, the LSB/EVEN and LSB/ODD pages of the $n^{th}$ word line are programmed, then the LSB/EVEN and LSB/ODD pages of the $(n+1)^{th}$ word line, then the CSB/EVEN and MSB/EVEN pages and the CSB/ODD and MSB/ODD pages of the $n^{th}$ word line, and then the CSB/EVEN and MSB/EVEN pages and the CSB/ODD and MSB/ODD pages of the $(n+1)^{th}$ word line. This word line programming order can be combined with the scheme of FIG. 7 using the following sequence:

Program the LSB/EVEN page in word line n.
Program the LSB/ODD page in word line n.
Program the four highest programming levels (148E . . . 148H) of the CSB/EVEN and MSB/EVEN pages in word line n−1 jointly.
Program the four lowest programming levels (148A . . . 148D) of the CSB/EVEN and MSB/EVEN pages in word line n−1 jointly.
Program the four highest programming levels (148E . . . 148H) of the CSB/ODD and MSB/ODD pages in word line n−1 jointly.
Program the four lowest programming levels (148A . . . 148D) of the CSB/ODD and MSB/ODD pages in word line n−1 jointly.

In an alternative embodiment, programming using the scheme of FIG. 7 can also be performed using the following sequence:

Program the LSB/EVEN page in word line n.
Program the LSB/ODD page in word line n.
Program the four highest programming levels (148E . . . 148H) of the CSB/EVEN and MSB/EVEN pages in word line n−1 jointly.
Program the four highest programming levels (148E . . . 148H) of the CSB/ODD and MSB/ODD pages in word line n−1 jointly.
Program the four lowest programming levels (148A . . . 148D) of the CSB/EVEN and MSB/EVEN pages in word line n−1 jointly.
Program the four lowest programming levels (148A . . . 148D) of the CSB/ODD and MSB/ODD pages in word line n−1 jointly.

Further alternatively, the joint CSB/MSB programming scheme of FIG. 6 or 7 can be combined with any other suitable word line programming order using any other suitable sequence.

Although the embodiments described herein mainly address data storage and retrieval in solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
predefining an order of programming a plurality of analog memory cells that are arranged in rows, wherein the memory cells in each row are associated with a respective word line, and wherein each memory cell is programmable to assume programming levels corresponding to respective analog values written to the memory cell,
wherein the order specifies that for a given row having neighboring rows on first and second sides, the memory cells in the given row are programmed only while the memory cells in the neighboring rows on at least one of the sides are in an erased state, and that the memory cells in the given row are programmed to assume one or more highest programming levels, which correspond to respective largest analog values among the analog values, only after programming all the memory cells in the given row to assume the programming levels other than the highest levels; and
storing data in the memory cells by programming the memory cells in accordance with the predefined order.

2. The method according to claim 1, wherein the given row is divided into at least first and second subsets of the memory cells for storing at least first and second memory pages.

3. The method according to claim 2, wherein the first subset comprises odd-order memory cells of the row and the second subset comprises even-order memory cells of the row.

4. The method according to claim 2, wherein the order alternates among the subsets when programming the memory cells in the given row.

5. The method according to claim 2, wherein the order specifies that the memory cells in the first subset are programmed to assume the programming levels other than the highest levels only after all the memory cells in the second subset are programmed to assume the programming levels other than the highest levels.

6. The method according to claim 1, wherein the memory cells in the given rows are subject to cross-coupling interference from the memory cells in the neighboring rows, and comprising reading the data stored in the neighboring rows and processing the read data so as to cancel the cross-coupling interference.

7. The method according to claim 1, wherein storing the data comprises initially programming the memory cells in accordance with an initial order that is different from the predefined order, evaluating a switching condition with respect to the memory cells, and switching to programming the memory cells in accordance with the predefined order responsively to meeting the switching condition.

8. Apparatus for data storage, comprising:
a memory, which comprises a plurality of analog memory cells that are arranged in rows, wherein the memory cells in each row are associated with a respective word line, and wherein each memory cell is programmable to assume programming levels corresponding to respective analog values written to the memory cell; and
a control module, which is coupled to predefine a programming order specifying that, for a given row having neighboring rows on first and second sides, the memory cells in the given row are programmed only while the memory cells in the neighboring rows on at least one of the sides are in an erased state, and that the memory cells in the given row are programmed to assume one or more highest programming levels, which correspond to respective largest analog values among the analog values, only after programming all the memory cells in the given row to assume the programming levels other than the highest levels, and to store data in the memory cells by programming the memory cells in accordance with the predefined programming order.

9. The apparatus according to claim 8, wherein the given row is divided into at least first and second subsets of the memory cells for storing at least first and second memory pages.

10. The apparatus according to claim 9, wherein the first subset comprises odd-order memory cells of the row and the second subset comprises even-order memory cells of the row.

11. The apparatus according to claim 9, wherein the order alternates among the subsets when programming the memory cells in the given row.

12. The apparatus according to claim 9, wherein the order specifies that the memory cells in the first subset are programmed to assume the programming levels other than the highest levels only after all the memory cells in the second subset are programmed to assume the programming levels other than the highest levels.

13. The apparatus according to claim 8, wherein the memory cells in the given rows are subject to cross-coupling interference from the memory cells in the neighboring rows, and wherein the control module is coupled to read the data stored in the neighboring rows and to process the read data so as to cancel the cross-coupling interference.

14. The apparatus according to claim 8, wherein the control module is coupled to initially program the memory cells in accordance with an initial order that is different from the predefined order, to evaluate a switching condition with respect to the memory cells, and to switch to programming the memory cells in accordance with the predefined order responsively to meeting the switching condition.

* * * * *